United States Patent [19]

Nose

[11] Patent Number: 5,397,915
[45] Date of Patent: Mar. 14, 1995

[54] SEMICONDUCTOR ELEMENT MOUNTING DIE PAD INCLUDING A PLURALITY OF EXTENDING PORTIONS

[75] Inventor: Sachiyuki Nose, Nagaokakyou, Japan

[73] Assignee: Matsushita Electronics Corporation, Kadoma, Japan

[21] Appl. No.: 834,466

[22] Filed: Feb. 12, 1992

[30] Foreign Application Priority Data

Feb. 12, 1991 [JP] Japan ................... 3-018168

[51] Int. Cl.6 .............. H01L 23/48; H01L 29/46; H01L 29/54; H01L 29/62
[52] U.S. Cl. .................... 257/676; 257/666
[58] Field of Search ............. 357/70, 68, 72; 257/666, 676, 670

[56] References Cited

U.S. PATENT DOCUMENTS

| 4,884,124 | 11/1989 | Mori et al. | 357/70 |
| 5,053,855 | 10/1991 | Michii et al. | 257/676 |
| 5,126,820 | 6/1992 | Brown | 357/70 |
| 5,175,610 | 12/1992 | Kobayashi | 257/676 |

FOREIGN PATENT DOCUMENTS

| 0345760 | 12/1989 | Italy . | |
| 58-207645 | 12/1983 | Japan | 357/70 |
| 62-268151 | 11/1987 | Japan . | |
| 64-82554 | 3/1989 | Japan . | |
| 1-251748 | 10/1989 | Japan | 357/70 |
| 2-125651 | 5/1990 | Japan | 357/70 |
| 2-292850 | 12/1990 | Japan . | |

Primary Examiner—Andrew J. James
Assistant Examiner—S. V. Clark
Attorney, Agent, or Firm—Ratner & Prestia

[57] ABSTRACT

A semiconductor element mounting die pad is supported by tie bars. Plural slits and dimples are disposed on a flat surface. The slits are penetrating from the face to the back side of the semiconductor element mounting die pad. Slits are formed, for example, by a punching or chemical etching method. These forming methods are the same as the method of forming the lead frame. Accordingly, if slits are disposed simultaneously when forming the lead frame, the process is not complicated. It is also possible to form these slits using the prior art. Slits of the same shape are formed at an interval of the width of dimples. The rear side is pushed out by press means to form dimples with the boundary of the slits. Thus, slits are formed in one body at both ends of the dimples. By thus composing, the thin type surface mount semiconductor device has a sufficient mechanical strength, and is capable of controlling the stress in a narrow region, so that a semiconductor device of high reliability is realized.

12 Claims, 4 Drawing Sheets

SEMICONDUCTOR ELEMENT MOUNTING DIE PAD INCLUDING A PLURALITY OF EXTENDING PORTIONS

BACKGROUND OF THE INVENTION

1. Field of the Invention

The present invention relates to a lead frame and a resin sealed semiconductor device using the same, and more particularly to the structure of a resin mold portion of a semiconductor device.

2. Description of the Prior Art

The resin mold portion of a resin sealed semiconductor device is intended to protect semiconductor elements from the external environment and to prevent destruction by external force. The recent requirement for performance of the resin mold portion of a resin sealed semiconductor device must follow up the upgrading of the function of semiconductor elements incorporated therein. The upgrading of the function of semiconductor elements refers to the fact that semiconductor elements have come to have multiple functions. In other words, the functions of circuits implemented by semiconductor elements has advanced, and the circuits have become more complicated. Furthermore, in forming the semiconductor elements, the surface patterns of semiconductor elements have become dimensionally finer and the wiring has been formed in multiple layers. In this way, the surface area of the semiconductor elements has become wider and wider.

On the other hand, the resin mold portion of the resin sealed semiconductor device must respond to the increase of area of the semiconductor elements, and cope with the development of the small and thin resin mold portion as demanded in the market. The resin sealed semiconductor device mounting the semiconductor elements may be roughly classified into the pin insertion type and the surface mount type. The surface mount type semiconductor device is smaller in the thickness of the resin mold portion than the pin insertion type. Accordingly, when the surface mount type semiconductor device is exposed to the environments of high temperature and high humidity, the device's sealing resin absorbs the moisture intruded from the environment by diffusion. In addition, the interior atmosphere of the surface mount type semiconductor device is balanced with the ambient atmosphere in a short time. Therefore the surface mount type semiconductor device which easily absorbed moisture is mounted on the printed circuit board or the like by soldering.

In this soldering process, the semiconductor device is dipped in a solder bath heated to the temperature of about 260 degrees Celsius, or heated by infrared rays to a temperature of about 240 degrees Celsius, or exposed to vapor phase at temperature of about 215 degrees Celsius. There is a difference in the coefficient of thermal expansion between the semiconductor elements mounting die pad and the sealing resin. By heat treatment, hence, delamination occurs in the interface of the semiconductor element mounting die pad the sealing resin which is the material of the resin mold portion. At this time, the absorbed moisture or water invading through suspension leads may be collected in the delamination area. When exposed to the temperature of heat treatment in such a state, it may give rise to destruction of the resin mold portion (package crack through the delamination of interface between the semiconductor element mounting die pad and the resin mold portion).

That is, the water content absorbed at heat treatment temperature reaches as high as the saturated steam pressure of water (30 to 40 kg/cm$^2$). This saturated steam pressure exceeds the mechanical strength of the sealing resin and induces breakdown of the resin mold portion.

The physical breakdown resistance of the resin used in the resin mold portion is proportional to the square of the distance from the lower surface of the semiconductor element mounting die pad to the rear surface of the resin mold portion, that is, the wall thickness of the sealing resin. That is, in order to fabricate the semiconductor device of high physical breakdown resistance sealing resin, the thickness of the sealing resin should be increased. To the contrary, for the surface mount type semiconductor device demanded by the market, the wall thickness of the sealing resin must be reduced. As a result, the surface mount type semiconductor device has a disadvantageous profile for heat treatment when soldering on the substrate.

A conventional surface mount type semiconductor device is shown in FIGS. 6 to 8.

In FIG. 6, a semiconductor element 1 is fabricated, for example, by forming oxide film, interlayer insulation film, polycrystalline silicon film and metal film on a single-crystalline silicon substrate, and forming a fine pattern by ordinary photolithographic technology. In addition, by combining with ordinary diffusion or ion implantation technology, a large capacity memory is fabricated. This semiconductor element 1 is formed in a rectangular parallelogram shape. It is affixed on the top surface of a quadrilateral semiconductor element mounting panel 3 of lead frame 2 by means of adhesive such as silver paste or solder. Bonding pads are disposed, corresponding to lead-out terminals of the semiconductor element mounting die pad 3. The bonding pads and plural leads 4 are connected using metal fine wires 5. The semiconductor element 1 connected thus to the leads 4 is molded with resin for sealing, leaving the front end regions of the leads 4. In this way, the resin sealed semiconductor device is composed.

FIG. 7 shows a sectional view of the semiconductor device shown in FIG. 6.

In this example, the resin mold portion 6 measures 2.7 mm in thickness, 8.89 mm in width, and 17.15 mm in length. The overall dimensions of the semiconductor element mounting die pad 3 are 0.2 mm in thickness, 6.00 mm in width and 15.4 mm in length. The thickness of the leads 4 is 0.2 mm. The thickness as measured from the lower surface of the semiconductor element mounting die pad 3 to the bottom of the resin mold portion 6 is a thin size of 1.05 mm. In this example, in relation to the size of the semiconductor element 1, the surface area of the semiconductor element mounting die pad 3 is 6 mm ×15.4 mm. That is, the rate of the surface area of the semiconductor element mounting die pad 3 to the area of the resin mold portion 6 is about 61%. In this way, the resin mold portion of the resin sealed semiconductor device is increased in the area of the semiconductor element, and further smaller and thinner resin mold portions are developed.

The semiconductor element mounting die pad 3 is made of a stiff material such as Alloy 42 (iron-nickel alloy). Therefore shrinkage stress occurs by the resin mold portion 6 at the time of resin molding of the semiconductor element 1.

This generation of shrinkage stress is explained in detail by reference to FIG. 8.

FIG. 8 is a magnified view of the region of the semiconductor element 1 and the lead 4 connected with the metal fine wire 5 on the semiconductor element mounting die pad 3.

This shrinkage stress is generated in the central concentrating direction (the direction of arrow A in the diagram) of the semiconductor element mounting die pad 3, in the resin mold portion 6 beneath the semiconductor element mounting die pad 3. A stress branching line B is formed, stretching in the vertical direction from the end portion of the semiconductor element mounting die pad 3.

The semiconductor element mounting die pad 3 is usually formed by punching a thin sheet. Accordingly the cut section is at a right angle to the bottom surface. The stress is concentrated in the stress concentration area C of the resin mold portion 6 contacting with the right-angled end portion of the semiconductor element mounting die pad 3.

In such a thin type resin sealed semiconductor device, cracks due to heat are likely to occur. For example, when quick cooling and quick heating from a temperature of −65 degrees to a temperature of 150 degrees are repeated several times, cracks are formed in the stress concentration area C of the resin mold portion 6. The stress is generated due to a difference of the coefficient of thermal expansion between the semiconductor element mounting die pad 3 and the sealing resin of the resin mold portion 6. Cracks occurring in the stress concentration area C are grown along the stress branching line B. As a result, cracks contacting with the air are formed in the resin mold portion 6. Through these cracks, moisture and impurities contained in the air are introduced. The moisture and impurities finally reach the semiconductor element 1 along the crack.

To solve these problems, a semiconductor element mounting die pad having dimples or slits has been proposed.

FIG. 9 is a cross section of the semiconductor device with dimples, being cut off along the center line of the tie bar.

The dimple structure refers to a structure in which grooves 7 or dimples are formed on the back side of the semiconductor element mounting die pad 3.

Delamination occurs in the interface between the semiconductor element mounting die pad 3 and the sealing resin of the resin mold portion 6. The moisture absorbed in this delamination region and the moisture invading through the tie bar is collected in the delamination area. When heated in such a state, as mentioned above, the resin mold portion 6 is broken. The dimple structure is particularly intended to prevent delamination in the interface of the semiconductor element mounting die pad 3 and the sealing resin of the resin mold portion 6. By forming grooves 7 or dimples in the semiconductor element mounting die pad 3, the contact area with the sealing resin is widened.

FIG. 10 is a cross section of the semiconductor device having slits cut off along the center line of the suspension lead.

FIG. 11 shows a plan view of the semiconductor element mounting panel having slits.

The slit structure refers to a structure in which oval holes 8 are penetrating through the face and back side of the semiconductor element mounting die pad 3.

Slits, as with dimples, are formed to prevent onset of delamination in the interface of the semiconductor element mounting die pad 3 and the sealing resin of the resin mold portion 6.

In the conventional structures, however, a sufficient mechanical strength is not obtained in the thin type surface mounted semiconductor device using the semiconductor element mounting die pad 3 with dimples. That is, when the moisture collected in the delamination area reaches the saturated steam pressure of water by heat treatment, breakdown of the resin mold portion 6 is provoked, exceeding the mechanical strength of the resin.

More specifically, by the grooves 7 or dimples of the semiconductor element mounting die pad 3 with dimples, the contact area with the sealing resin is increased. However, only the resin is injected in the grooves 7 or dimples, and the adhesion strength of the resin and the semiconductor element mounting die pad 3 is not improved greatly.

In the thin type surface mount semiconductor device using the semiconductor element mounting die pad 3 with slits, too, sufficient mechanical strength is not obtained. By the holes 8 in the semiconductor element mounting die pad 3, the contact area with the sealing resin is increased. But only the resin is buried in the holes 8, and the adhesion strength of the resin and semiconductor element mounting die pad 3 is not greatly improved. However, the adhesion strength of slits is greater than that of dimples.

The slits are formed as shown in FIG. 11. When the stress is distributed uniformly in the semiconductor element 1, it is suited to the semiconductor element mounting die pad 3 with slits. However, when the stress distribution is not uniform or the stress varies in the small area in the semiconductor element 1, it is difficult to control the stress.

Furthermore, solder for adhering the semiconductor element 1 does not deposit in the area of the holes 8 of the semiconductor element mounting die pad 3 with slits, and the contact area of the semiconductor element 1 and the semiconductor element mounting die pad 3 decreases. Accordingly, when the moisture collected in the delamination area reaches the saturated steam pressure of water by heat treatment, breakdown of the resin mold portion 6 is induced, exceeding the mechanical strength of the resin.

Thus, in the semiconductor device having dimples or slits, it is difficult to sufficiently prevent breakdown of the resin mold portion 6. If the resin mold portion 6 is broken, or cracks contacting with the air are formed in the resin mold portion 6, moisture and impurities contained in the air invade through the cracks. The moisture and impurities reach the semiconductor element 1 through the cracks. As a result, the adjacent leads 4 are short-circuited by moisture, thereby causing malfunctions.

Or the impurities contained in the sealing resin are extracted by moisture. The extracted impurities may corrode the wiring metal. By this corrosion, the wiring may be disconnected.

In addition, the moisture invading through the cracks gets into the solder or silver paste adhering the semiconductor element 1 on semiconductor element mounting die pad 3. Consequently, the semiconductor element 1 is delaminated off the semiconductor element mounting die pad 3, or the semiconductor element 1 is warped by the subsequent heat treatment. As the semiconductor element 1 is warped, the characteristics of the semiconductor elements formed inside deteriorate.

Therefore, formation of cracks in the semiconductor device will notably impair the reliability of the semiconductor element 1.

In the light of the above problems, it is hence a primary object of the invention to present a highly reliable semiconductor device having a sufficient mechanical strength and capable of controlling the stress in a narrow region, in a thin type surface mount semiconductor device.

SUMMARY OF THE INVENTION

The lead frame of the invention comprises tie bars connected to the frame body, a semiconductor element mounting die pad connected to the tie bars, a plurality of leads extending toward the semiconductor element mounting die pad, and dam bars connected to the leads, wherein plural slits and dimples are formed in the semiconductor element mounting die pad.

Also, to solve the above problems, the resin sealed semiconductor device of the present invention comprises plural slits and dimples formed in the semiconductor element mounting die pad of the lead frame, a semiconductor element mounted on the semiconductor element mounting die pad, leads connected to the semiconductor elements through metal fine wires, and a resin mold portion for enveloping at least the semiconductor element and semiconductor element mounting die pad.

In this constitution, the sealing resin is injected around the dimples. Accordingly, the semiconductor element mounting die pad is firmly bonded to the resin mold portion. As a result, corrosion of wiring metal due to impurities contained in the sealing resin may be eliminated. It is also possible to have a sufficient mechanical strength for preventing destruction of the resin mold portion.

In addition, moisture is prevented from invading into the solder or silver paste adhering the semiconductor element and the semiconductor element mounting die pad, and therefore the semiconductor element will not be separated off the semiconductor element mounting die pad, or the semiconductor element will not be warped by subsequent heat treatment.

Furthermore, the dimple and slits are combined and their area is small, and hence the stress may be controlled in the narrow region in the semiconductor element not only when the stress is distributed uniformly in the semiconductor element 1 but also when the stress distribution is not uniform, so that it may be possible to cope with sufficiently, even if the resin mold portion is further reduced in thickness.

DESCRIPTION OF THE PREFERRED EMBODIMENT

Figure 1:
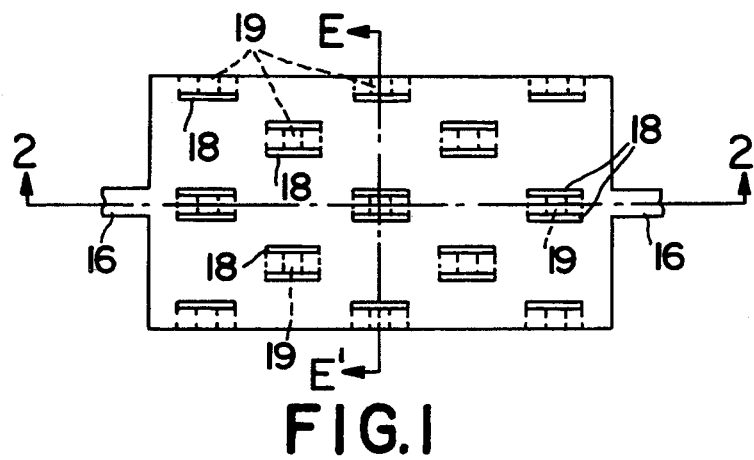
FIG. 1 is a magnified plan view of a semiconductor element mounting die pad of a resin sealed semiconductor device of the invention.

Referring now to the drawings (FIGS. 1-3), an embodiment of the invention is described in detail below. In the drawings, numeral 11 is a lead frame, 12, 12a, 12b are frame bodies, 13 is a semiconductor element, 14 is a semiconductor element mounting panel, 15 is a lead, 16 is a tie bar, 17 is a dam bar, 18 is a slit, 19 is a dimple, and 20 is a metal fine wire.

Figure 3:
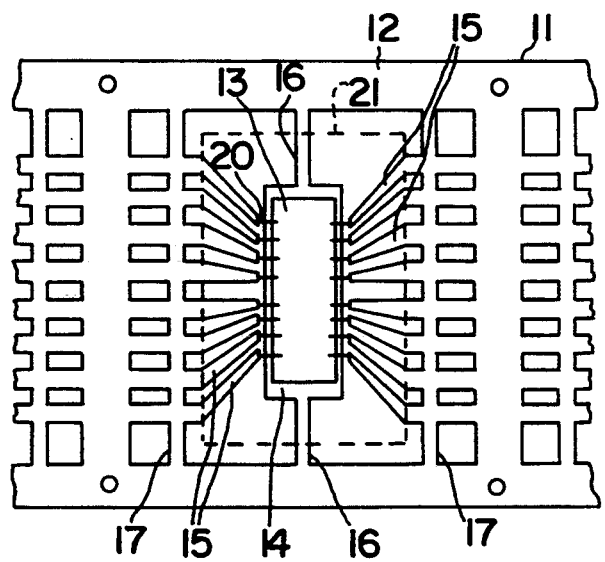
FIG. 3 is a plan view of a lead frame used in the resin sealed semiconductor device of the invention.

FIG. 3 is a plan view of the lead frame used in the resin sealed semiconductor device in a first embodiment.

The lead frame 11 is formed by punching or chemically etching a thin sheet of iron-nickel alloy system (Fe-Ni 42%, Fe-Ni 48%, Fe-Ni 50%), Kovar, copper alloy system or other material.

The thin sheet is removed completely, leaving a desired shape. Thus, the lead frame 11 is composed of the blanked space portion and the thin sheet portion.

The region forming the punched space portion and thin sheet portion into one body is composed continuously in the thin sheet. The frame body 12 is formed in order to form the punched space portion and thin sheet portion continuously, stably and at high reliability. The region of the frame body 12a is disposed at both ends along the longitudinal direction of the thin sheet. Furthermore, in the isolating region of the adjacent space portion and thin sheet portion, a region of frame body 12b is also formed in the lateral direction of the thin sheet.

The semiconductor element mounting die pad 14 is formed in the lead frame 11. The semiconductor element 13 is put on the semiconductor element mounting die pad 14. Accordingly, the shape of the semiconductor element mounting die pad 14 is rectangular. To fix the semiconductor element mounting die pad 14, tie bars 16 are provided. The tie bars 16 couple the frame body 12a in the longitudinal direction with the semiconductor element mounting die pad 14. Thus, the semiconductor element mounting die pad 14 is supported by the tie bars 16. At this time, the tie bars 16 are extended from the front end of the longitudinal direction of the semiconductor element mounting die pad 14. In this manner, the semiconductor element mounting die pad 14 may be disposed stably.

A plurality of leads 15 are extending toward the semiconductor element mounting die pad 14. The leads 15 are formed at a right angle to the frame body 12b. The number of leads 15 is equal to the number of required pins in the semiconductor device. To keep the leads 15 flat, they are supported by a dam bar 17. The width of the dam bar 17 is smaller than that of the frame body 12b. The dam bar 17 is formed at a right angle to the frame body 12a (parallel to the frame body 12b). The both ends of the dam bar 17 are fitted to the frame body 12a. Thus, the leads 15 are formed flat.

From the dam bar 17 to the resin mold portion 21 (the dotted line region in the diagram) formed after mounting the semiconductor element 13, the leads 15 are extending at a right angle to the frame body 12b. The leads 15 positioned inside of the resin mold portion 21 are formed for the ease of wire bonding of the bonding pad of the semiconductor element 13 and the leads 15. That is, the leads 15 are bent toward the semiconductor element mounting die pad 14 positioned in the center of the lead frame 11. In this way, the metal fine wire 20 may be easily formed at the front end of the bonding pad of the semiconductor element 13 and the leads 15. Here, since the semiconductor element mounting die pad 14 and the leads 15 must be electrically insulated, a physical space is provided between them.

FIG. 1 is a magnified plan view of the semiconductor element mounting die pad 14 of the resin sealed semiconductor device of the invention.

The semiconductor element mounting die pad 14 is supported by the tie bars 16 as mentioned above. Plural slits 18 and dimples 19 are disposed on the plane. The slits 18 are through from the face to the back sides of the semiconductor element mounting die pad 14. In forming of slits 18, for example, punching or chemical etching is employed. These methods are the same as the methods for forming the lead frame 11. Therefore, if Slits are disposed at the same time when forming the lead frames 11, the process is not complicated. The slits can also be formed by methods known in the prior art.

Slits 18 of the same shape are formed at an interval of the width of dimples 19. On the boundary of the slits 18, dimples 19 are formed by pushing out to the back side by press means. Thus, the dimples 19 are formed together with slits 18 in one body at both ends.

In this example, the slits 18 are formed in the direction of the tie bar 16, but the slits 18 may also be formed at a right angle to the tie bar 16. In this case, the dimples 19 are also formed at a right angle to the tie bar 16.

In the diagram, the pair of slit 18 and dimple 19 is symmetric on line 2—2. Or it may be also symmetric on line E—E' linking the center in the longitudinal direction of the semiconductor element mounting die pad. This symmetric forming of the pair of slit 18 and dimple 19 is intended to uniformly disperse the stress applied on the semiconductor element mounting die pad 14. That is, the manner of application of stress depends on the shape of the semiconductor element 13. In this example, one semiconductor element 13 is put on the semiconductor element mounting die pad 14. An almost uniform stress is applied on one semiconductor element 13.

For example, in the multichip putting two or more semiconductor elements 13 on one semiconductor element mounting die pad 14, the stress is not applied uniformly. If the stress is not applied uniformly on the semiconductor element 13 in this way, a pair of slit 18 and dimple 19 is formed depending on the distribution state of the stress. In this case, the pair of slit 18 and dimple 19 does not always distribute symmetrically on the semiconductor element mounting die pad 14.

The dimple 19 in this embodiment is 0.2 to 1.2 mm in width, 0.4 to 1.5 mm in length, and the width of slit 18 is 0.1 to 0.8 mm.

The width and length of dimple 19 and width of slit 18 depends on manufacturing restrictions. When press technology and etching technology develop further, it will be possible to use dimples with dimensions smaller than the dimensions previously described. When the dimples 19 and slits 18 can be formed finely, the stress distribution may be precisely controlled. That is, the pair of slit 18 and dimple 19 is disposed at the position corresponding to the stress induced in the process forming the resin mold portion 21. Thus, the stress occurring locally may be dispersed uniformly.

The upper limit of the width of the dimple 19 varies significantly depending on the area of the semiconductor element mounting die pad 14. As the area of the semiconductor element mounting pad 14 becomes wider, the upper limit may be extended. However, if the upper limit is too large, it is difficult to control the stress, and cracks due to stress concentration are formed.

Thus the dimple 19 and slit 18 are combined and their area is small, and therefore, if the stress is distributed uniformly in the semiconductor element 13, the stress can be controlled in the narrow region in the semiconductor element 13, and it does not matter if the resin mold portion is further reduced in thickness.

Figure 2:
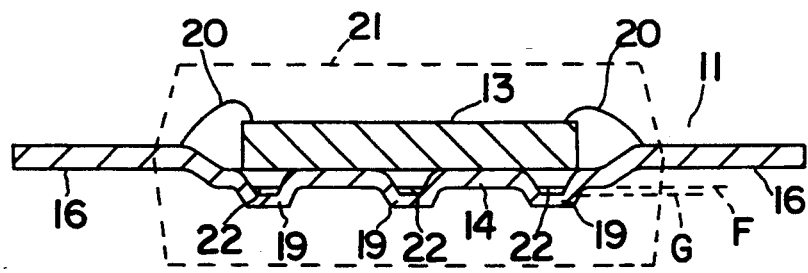
FIG. 2 is a cross section 2—2 of the resin sealed semiconductor device of the invention shown in FIG. 1.

FIG. 2 is a cross section 2—2 of the resin sealed semiconductor device of the invention shown in FIG. 1.

The semiconductor element mounting die pad 14 is supported by two tie bars 16. In this embodiment, the dimples 19 are disposed at three positions in the semiconductor element mounting die pad 14. This section is a sectional shape along the longitudinal direction of the slits 18 disposed at both ends of the dimples 19. There is accordingly a cavity 22 as the clearance between the bottom line F of the semiconductor element mounting die pad 14 and the top line G of the bottom of the dimple 19.

When forming the resin mold portion 21, this resin pours into the dimples 19 to bond the semiconductor element 13 and semiconductor element mounting die pad 14 firmly. For this purpose, the size of the cavity 22 is enough only if the resin of the resin mold portion 21 can pour into the dimples 19 and penetrate through.

Thus, the resin is injected around the dimples 19 for sealing. Thereby the semiconductor element mounting die pad 14 is bonded firmly to the resin mold portion 21. It helps eliminate corrosion of wiring metal due to impurities contained in the resin mold portion 21. At the same time, it is possible to have a sufficient mechanical strength for preventing breakdown of the resin mold portion 21.

It is also possible to prevent invasion of moisture into the solder or silver paste adhering the semiconductor element 13 and the semiconductor element mounting die pad 14, and hence the semiconductor element 13 will not be delaminated and the semiconductor element mounting die pad 14 or the semiconductor element 13 will not be warped due to subsequent heat treatment.

On the surface of the semiconductor element mounting die pad 14, the semiconductor element 13 is bonded by synthetic resin adhesive. For this bonding, synthetic resin adhesive is used, but it is also possible to adhere similarly using tin-lead solder or silicone resin.

The reducing atmosphere should be sufficiently maintained when diebonding. As long as the reducing atmosphere is maintained, soldering forms the same film as made by plating. Therefore the solder does not cause adverse effects by, for example, getting into the dimples 19 to plug the dimples 19.

If the dimples 19 are covered by the solder, a so-called deformed dimple structure is formed. In this case, as compared with this embodiment, the adhesion strength of the semiconductor element mounting die pad 14 and semiconductor element 13 becomes lower.

The bonding pad formed on the semiconductor element 13 is wire-bonded to the lead 15 by a metal fine wire 20. Afterwards, in the region indicated by the dotted line in FIG. 2, the resin mold portion 21 is formed. That is, the dotted line region is molded by the synthetic resin. Then by sealing, the resin mold portion 21 is formed.

Later, the resin patch formed between the inside of the dam bar 17 and the wall of the resin mold portion 21 is punched out. In succession, cutting off the dam bar 17 between leads 15 and the outer front end portion of the lead 15, the leads 15 are formed into specified shape. In this process, the resin sealed semiconductor device is completed.

Figure 4:
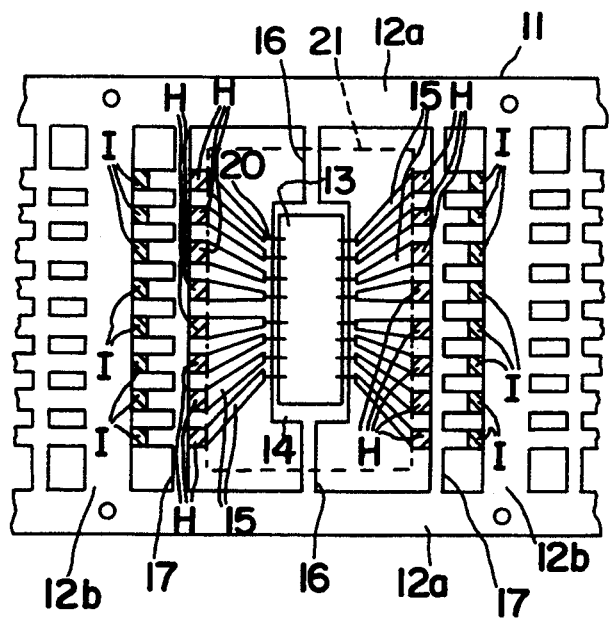
FIG. 4 is a plan view of the lead frame for explaining the formation of a resin patch.

FIG. 4 shows a plan view of the lead frame for explaining the formation of the resin patch. The entire structure is the same as explained in FIG. 3.

The frame body 12 is disposed on the lead frame 11. The frame body 12a region runs in the longitudinal direction of the thin sheet, and the frame body 12b region is disposed in the lateral direction.

The semiconductor element mounting die pad 14 is joined with the lead frame 11 through tie bars 16. The semiconductor element 13 is put on the semiconductor element mounting die pad 14. To fix the semiconductor element mounting die pad 14, the tie bar 16 is disposed. Thus, the semiconductor element mounting die pad 14 is supported by the tie bars 16.

A plurality of leads 15 are extending toward the semiconductor element mounting die pad 14. To keep the leads 15 flat, they are supported by a dam bar 17.

From the dam bar 17 to the resin mold portion 21 (dotted line region) formed after mounting the semiconductor element 13, the leads 15 are extending at a right angle to the frame body 12b. The leads 15 are bent toward the semiconductor element mounting die pad 14 located in the center of the lead frame 11. The bonding pad of the semiconductor element 13 and the front end of the lead 15 are joined with metal fine wire 20.

Afterwards, when forming the resin mold portion 21 in the region indicated by the dotted line in FIG. 4, the resin adheres in region H which is between the inside of the dam bar 17 and the wall of the resin mold portion 21. The resin depositing in this manner is called the resin patch. In resin sealing, when pouring resin, in order to prevent the resin from flowing out to the side surface, the dam bar 17 is formed. The injected resin flows toward the dam bar 17, and the resin is solidified to form a resin patch (also known as a thick burr). The resin patch is formed in the region H between the inside of the dam bar 17 and the wall of the resin mold portion 21. Since the surface of the region H is plated in consequent process, this resin patch is punched out. In succession, the dam bar 17 portion between the leads 15 and the outer front end portion of the leads 15 are cut off. The outer front end portion is region I in the diagram. Thus, the leads 15 are formed into a specified shape.

The resin for sealing fills up the inside of the dimples 19 from the cavity 22 in the dimples 19. At this time, the resin also contacts with the rear side of the semiconductor element 13 on the dimples 19. In this way, the semiconductor element mounting die pad 14 is firmly bonded to the resin mold portion 21.

If the semiconductor element 13 molded in resin is heated or cooled quickly, cracks are not formed.

Generally, the coefficient of thermal expansion differs between the semiconductor element mounting die pad 14 and the resin mold portion 21. Accordingly, by quick heating or quick cooling, a stress occurs for the differential portion of the coefficient of thermal expansion. In this embodiment, however, since the slits 18 and dimples 19 are formed in the semiconductor element mounting die pad 14, the stress is dispersed and absorbed by the dimples 19, so that formation of cracks due to stress may be prevented.

When crack formation is prevented, moisture and impurities in air will not invade inside into the semiconductor element 13. Hence, the reliability of the semiconductor device may be greatly enhanced.

If the resin sealed semiconductor device in this embodiment was suddenly heated at the temperature of about 260 degrees, the resin mold portion 21 and the semiconductor element mounting die pad 14 were not separated. If heated and cooled quickly in a temperature range of −65 degrees to 150 degrees, it was confirmed that cracks were not caused in the resin mold portion 21.

In this embodiment, the slits 18 were formed parallel, and the dimples 19 were formed linearly, but the dimples 19 may be also formed in square, star-shape, rhombic form, triangle, circle or their deformations, that is, the side portions may be formed in slits while leaving corners or other parts.

The linear dimples 19 are suited to a rectangular semiconductor element 13.

That is, if the semiconductor element is compressed from outside, a square semiconductor element is deformed with a greater force than a rectangular semiconductor element. That is, the rectangular shape is more likely to be deformed by the stress of distortion.

If the square semiconductor element 13 receives a uniform external force, it is desired that the drag applied on the semiconductor element 13 be uniform. Accordingly, if the shape of the dimple 19 is symmetrical about a point, the stress may be applied uniformly. That is, a uniform stress distribution is realized when the shape of the dimple 19 is symmetrical about a point, such as square, star-shape, rhombus, triangle, circle or their deformations.

FIG. 5 shows a magnified view of the peripheral part of the dimples 19 by half etching of the dimple 19 by chemical etching or other method.

Figure 5A:
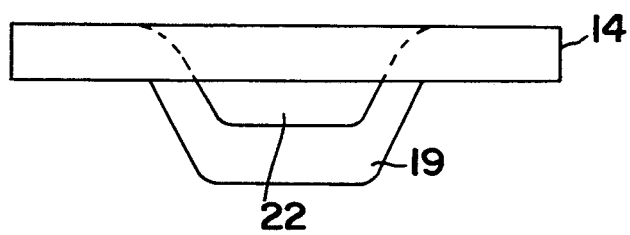
FIGS. 5A and 5B are magnified views of peripheral parts of dimples by half etching of dimples.
Figure 5B:
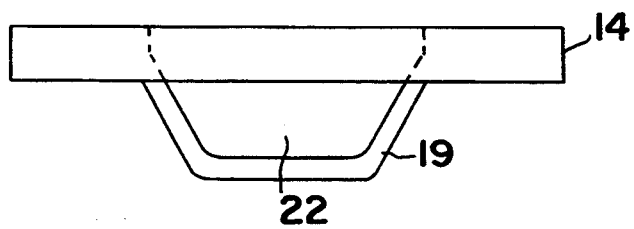
Figure 6:
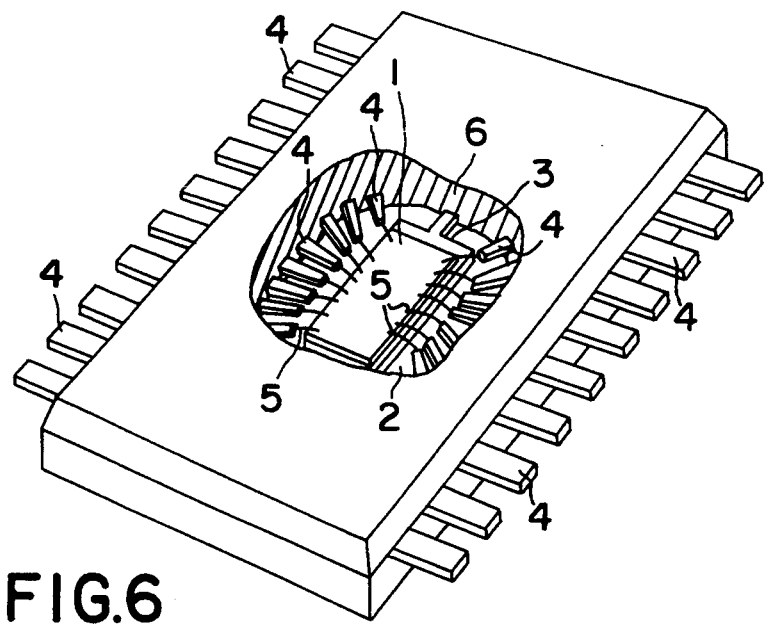
FIG. 6 is a perspective view of a conventional surface mount semiconductor device.
Figure 7:
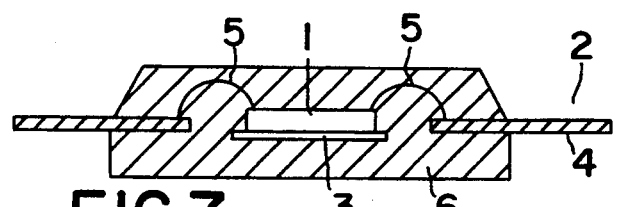
FIG. 7 is a cross section of a conventional surface mount semiconductor device.
Figure 8:
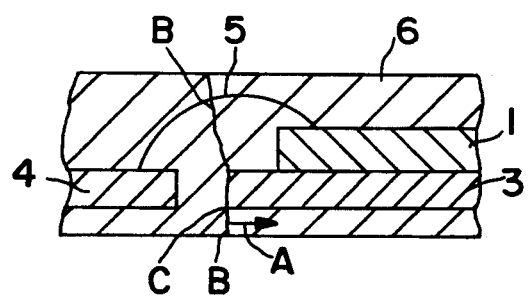
FIG. 8 is a partially magnified view of a conventional surface mount semiconductor device.
Figure 9:
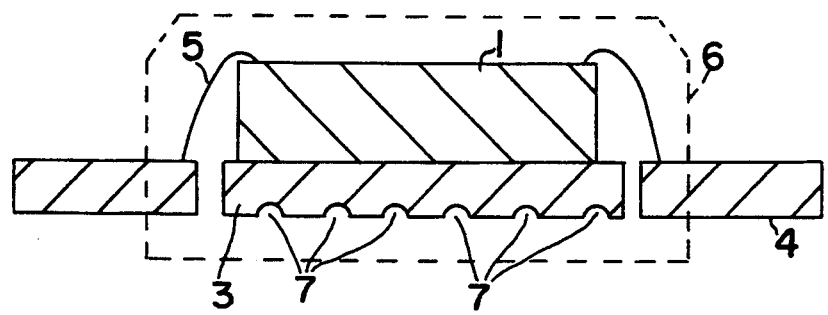
FIG. 9 is a cross section of a conventional semiconductor device with dimples.
Figure 10:
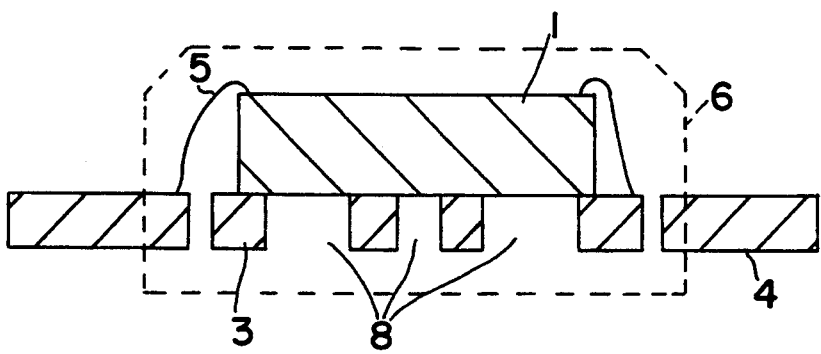
FIG. 10 is a cross section of a conventional semiconductor device with slits.
Figure 11:
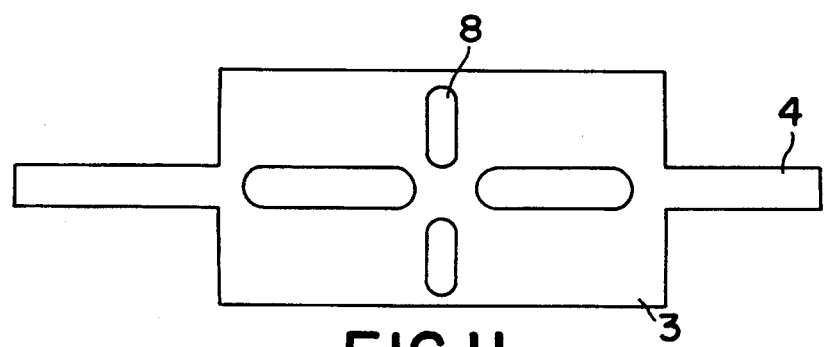
FIG. 11 is a plan view of a conventional semiconductor element mounting panel with slits.

FIG. 5(a) is a magnified view in a state without half etching, and FIG. 5(b) is a magnified view after half etching.

Seeing the dimple 19 from the section, the cavity 22 is formed. Before and after half etching, the size of this cavity 22 is different. By half etching, the thickness of the dimple 19 is reduced. Accordingly, the area of the cavity 22 is substantially increased. As a result, the resin used in the resin mold portion 21 is free to flow into the cavity 22 of the dimple 19, and the semiconductor element 13 and semiconductor element mounting die pad 14 are bonded firmly. By half etching in this way, the size of the cavity 22 may be increased, and the resin of the resin mold portion 21 is free to pour and penetrate into the dimple 19. Thus, by half etching, an allowance is given to the material strength of the resin.

In the semiconductor device of the invention, the semiconductor element mounting die pad 14 is firmly bonded with the resin mold portion 21. As a result, corrosion of wiring metal by the impurities contained in the sealing resin may be eliminated. At the same time, the mechanical strength is sufficient to prevent breakdown of the resin mold portion 21.

It is also effective to prevent invasion of moisture into the solder or silver paste adhering the semiconductor element 13 and semiconductor element mounting die pad 14.

Furthermore, even if the stress distribution in the semiconductor element 13 is not uniform, the stress can be controlled in the narrow region in semiconductor element 13.

What is claimed:

1. A lead frame comprising:

a tie bar connected to a frame body, a semiconductor element mounting die pad connected to the tie bar, and a plurality of leads extending toward the semiconductor element mounting die pad, a plurality of portions:

each of which is situated below a plane which is situated along a lower surface of said semiconductor element mounting die pad, each of which forms a respective passageway extending between said lower surface of said semiconductor element mounting die pad and an upper surface of said semiconductor element mounting die pad, each of which forms a respective space which extends along a longitudinal cross section of the semiconductor element mounting die pad, and each of which has a bottom surface which is substantially parallel to said plane.

2. A lead frame according to claim 1, wherein each of said plurality of portions is completely situated on one of one side and another side of a line intersecting said semiconductor element mounting die pad.

3. A lead frame according to claim 1, wherein each of said portions is physically connected to said semiconductor element mounting die pad by no more than two supporting members.

4. A lead frame according to claim 1, wherein each of said portions is substantially parallel to the lower surface of said semiconductor element mounting die pad.

5. A lead frame according to claim 1, wherein at least one of said portions is situated at an edge of said semiconductor element mounting die pad.

6. A resin sealed semiconductor device comprising:

a semiconductor element mounting die pad;

a semiconductor element disposed on an upper surface of the semiconductor element mounting die pad;

leads connecting the semiconductor element through metal fine wires;

a resin mold portion enveloping at least the semiconductor element and the semiconductor element mounting die pad; and a plurality of portions:

each of which is situated below a plane which is situated along a lower surface of said semiconductor element mounting die pad, each of which forms a respective passageway extending between said lower surface of said semiconductor element mounting die pad and said upper surface of said semiconductor element mounting die pad, and each of which forms a respective space which extends along a longitudinal cross section of the semiconductor element mounting die pad.

7. A resin sealed semiconductor device according to claim 6, wherein each of said plurality of portions is completely situated on one of one side and another side of a line intersecting said semiconductor element mounting die pad.

8. A resin sealed semiconductor device according to claim 6, wherein each of said portions is physically connected to said semiconductor element mounting die pad by no more than two supporting members.

9. A resin sealed semiconductor device according to claim 6, wherein each of said portions is substantially parallel to the lower surface of said semiconductor element mounting die pad.

10. A resin sealed semiconductor device according to claim 6, wherein at least one of said portions is situated at an edge of said semiconductor element mounting die pad.

11. A lead frame comprising:

a tie bar connected to a frame body, a semiconductor element mounting die pad connected to the tie bar, and a plurality of leads extending toward the semiconductor element mounting die pad, a plurality of portions:

each of which is situated below a plane which is situated along a lower surface of said semiconductor element mounting die pad, and each of which forms a respective passageway extending between said lower surface of said semiconductor element mounting die pad and an upper surface of said semiconductor element mounting die pad, wherein at least one of said portions is situated at an edge of said semiconductor element mounting die pad.

12. A resin sealed semiconductor device comprising:

a semiconductor element mounting die pad, a resin mold portion enveloping at least the semiconductor element and the semiconductor element mounting die pad, a plurality of leads extending toward the semiconductor element mounting die pad, a plurality of portions:

each of which is situated below a plane which is situated along a lower surface of said semiconductor element mounting die pad, and each of which forms a respective passageway extending between said lower surface of said semiconductor element mounting die pad and an upper surface of said semiconductor element mounting die pad, wherein at least one of said portions is situated at an edge of said semiconductor element mounting die pad.

* * * * *